United States Patent
Ojima et al.

(10) Patent No.: US 11,689,177 B2
(45) Date of Patent: Jun. 27, 2023

(54) ELECTRONIC DEVICE AND MANUFACTURING METHOD THEREFOR

(71) Applicant: Murata Manufacturing Co., Ltd., Nagaokakyo (JP)

(72) Inventors: Shigeo Ojima, Nagaokakyo (JP); Isao Ikeda, Nagaokakyo (JP); Koki Sai, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 42 days.

(21) Appl. No.: 17/406,362

(22) Filed: Aug. 19, 2021

(65) Prior Publication Data

US 2021/0384883 A1 Dec. 9, 2021

Related U.S. Application Data

(63) Continuation of application No. PCT/JP2020/008635, filed on Mar. 2, 2020.

(30) Foreign Application Priority Data

Mar. 29, 2019 (JP) .................................. 2019-067280

(51) Int. Cl.
*H03H 9/02* (2006.01)
*H03H 3/04* (2006.01)

(52) U.S. Cl.
CPC .......... *H03H 9/02023* (2013.01); *H03H 3/04* (2013.01); *H03H 2003/0457* (2013.01)

(58) Field of Classification Search
CPC .... H03H 9/02023; H03H 9/19; H03H 9/1014; H03H 9/0519; H03H 3/04; H03H 3/02; H03H 2003/0457; H03H 2003/022
See application file for complete search history.

(56) References Cited

U.S. PATENT DOCUMENTS

2012/0075030 A1* 3/2012 Iwasaki ................ B81B 7/0077
438/689
2014/0162391 A1 6/2014 Yoshizawa
(Continued)

FOREIGN PATENT DOCUMENTS

JP 2004186995 A 7/2004
JP 2010245829 A 10/2010
(Continued)

OTHER PUBLICATIONS

International Search Report issued for PCT/JP2020/008635, dated Apr. 21, 2020.
(Continued)

*Primary Examiner* — Jeffrey M Shin
(74) *Attorney, Agent, or Firm* — ArentFox Schiff LLP

(57) ABSTRACT

An electronic device that includes a base substrate having a mounting surface; an electronic component having a mechanical vibration portion mounted on the mounting surface of the base substrate; an intermediate layer mounted on the base substrate and forming an internal space with the base substrate so as to accommodate the electronic component therein, the intermediate layer having at least one through-hole that opens the internal space to an outside; and a sealing layer on the intermediate layer and sealing the internal space by closing the at least one through-hole.

11 Claims, 13 Drawing Sheets

(56) References Cited

U.S. PATENT DOCUMENTS

| | | | | |
|---|---|---|---|---|
| 2014/0361842 A1* | 12/2014 | Chen | ................... | G04F 5/063 |
| | | | | 331/116 R |
| 2015/0015118 A1* | 1/2015 | Kamijo | ................ | H03H 9/1021 |
| | | | | 29/25.35 |
| 2017/0288627 A1 | 10/2017 | Takano et al. | | |

FOREIGN PATENT DOCUMENTS

| | | | |
|---|---|---|---|
| JP | 2013207674 | A | 10/2013 |
| JP | 2014116707 | A | 6/2014 |
| JP | 2017163613 | A | 9/2017 |
| JP | 2017196727 | A | 11/2017 |
| WO | 2011114628 | A1 | 9/2011 |
| WO | 2017208747 | A1 | 12/2017 |

OTHER PUBLICATIONS

Japanese Office Action issued for JP Patent Application No. 2021-511263, date of Japanese Office Action dated Mar. 17, 2022.
Written Opinion of the International Searching Authority issued for PCT/JP2020/008635, dated Apr. 21, 2020.

* cited by examiner

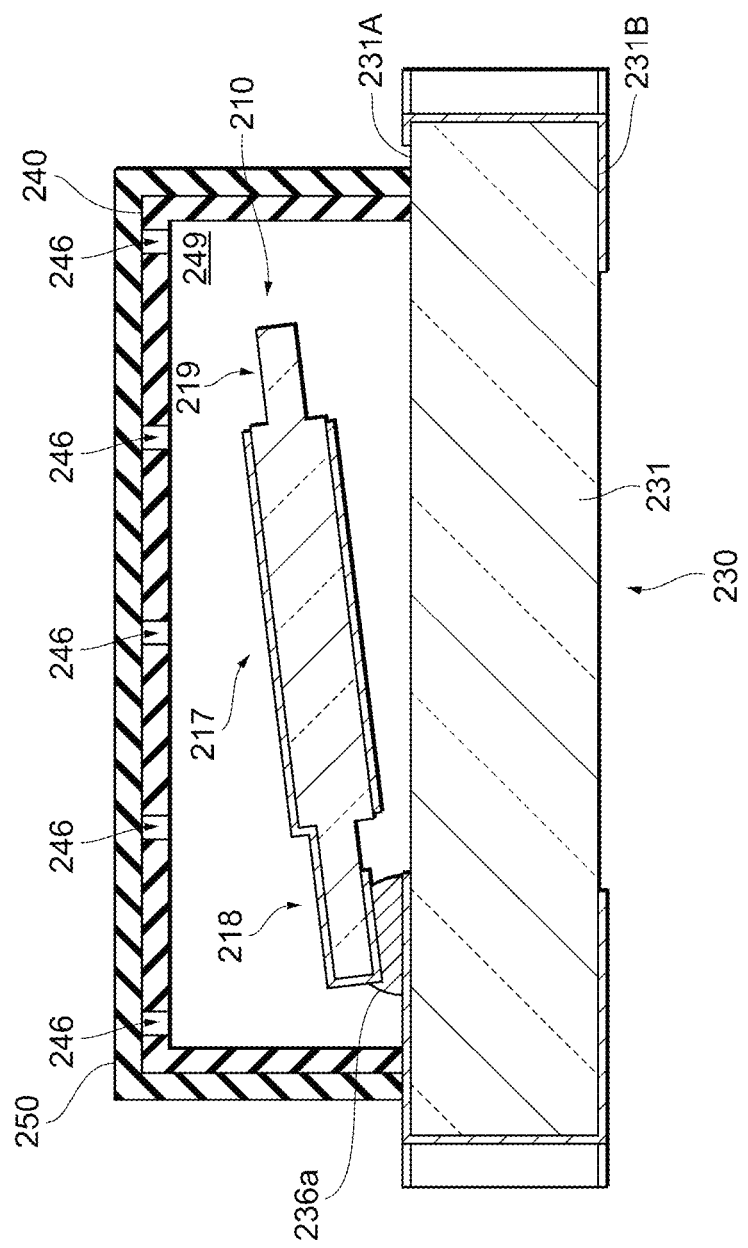

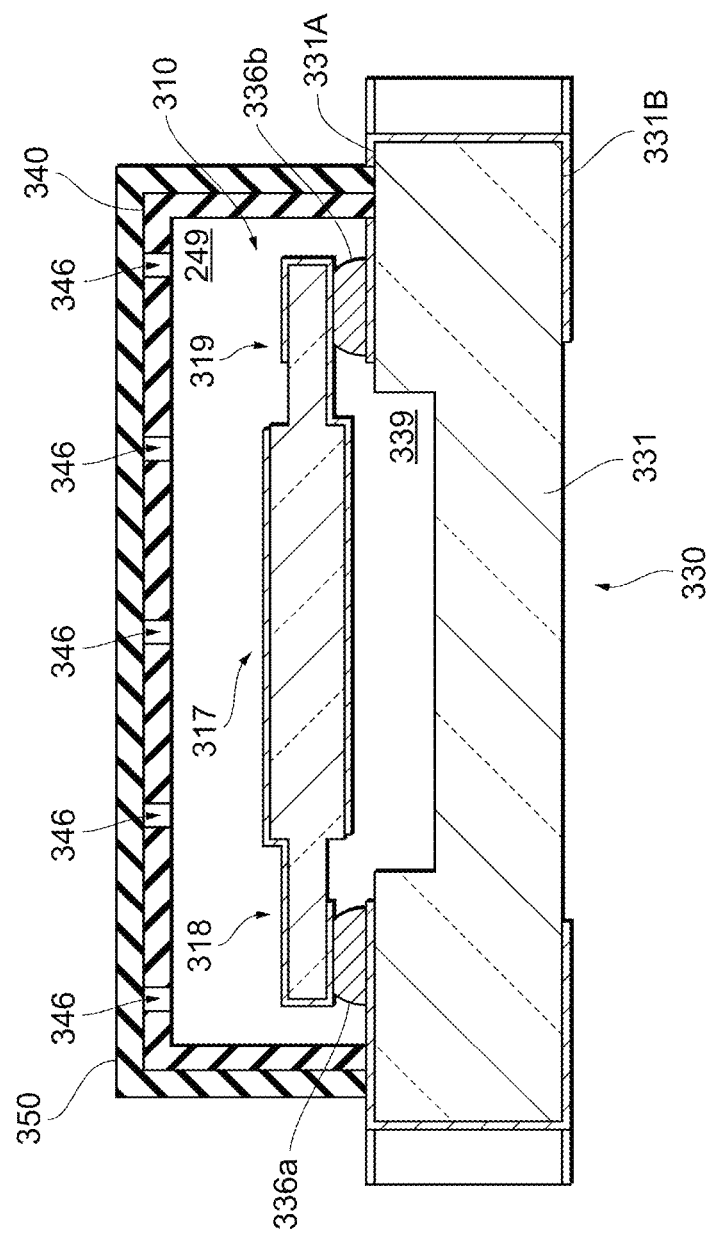

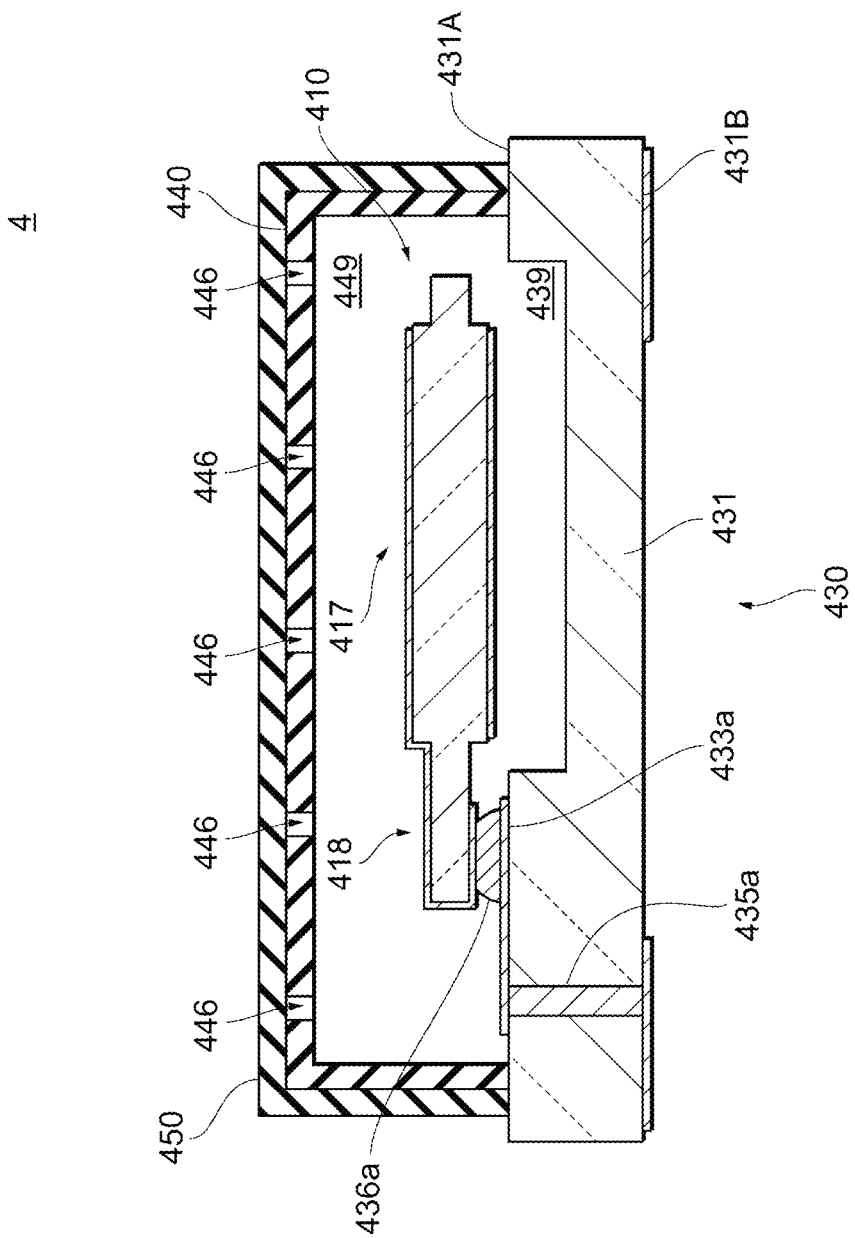

ELECTRONIC DEVICE AND MANUFACTURING METHOD THEREFOR

CROSS REFERENCE TO RELATED APPLICATIONS

The present application is a continuation of International application No. PCT/JP2020/008635, filed Mar. 2, 2020, which claims priority to Japanese Patent Application No. 2019-067280, filed Mar. 29, 2019, the entire contents of each of which are incorporated herein by reference.

FIELD OF THE INVENTION

The present invention relates to an electronic device and a manufacturing method therefor.

BACKGROUND OF THE INVENTION

An electronic device including an electronic component having a mechanical vibration portion is, for example, a piezoelectric resonator unit that is used as a timing device or a load sensor. A piezoelectric resonator unit is made up of a piezoelectric resonator and a holder. The piezoelectric resonator has a mechanical vibration portion that converts an electrical oscillation to a mechanical vibration by using a piezoelectric effect. The holder accommodates the piezoelectric resonator.

For example, Patent Document 1 describes a piezoelectric device including a piezoelectric resonator element, intermediate films, and sealing films. The piezoelectric resonator element has a vibration portion that is thinner than a peripheral portion. The intermediate films are respectively formed on the front surface and the back surface of the piezoelectric resonator element. The intermediate films are spaced apart from the vibration portion and are joined with the peripheral portion. The sealing films are respectively formed on the surfaces of the intermediate films and laminated on the intermediate films. In this way, according to Patent Document 1, because a piezoelectric device is created at the wafer level, the cost can be reduced and excellent vibration characteristics are provided.

Patent Document 1: Japanese Unexamined Patent Application Publication No. 2017-163613

SUMMARY OF THE INVENTION

However, in the piezoelectric device described in Patent Document 1, the peripheral portion surrounding the vibration portion in a frame shape is in contact with the intermediate films and the sealing films, so a stress applied from the outside is easily transferred to the vibration portion. For this reason, there may arise a problem that frequency fluctuations due to the stress increase.

The present invention is made in view of such circumstances, and it is an object of the present invention to provide an electronic device that has small frequency fluctuations due to a stress and that can be reduced in size and a manufacturing method for the electronic device.

An electronic device according to an aspect of the present invention includes a base substrate having a mounting surface; an electronic component having a mechanical vibration portion mounted on the mounting surface of the base substrate; an intermediate layer mounted on the base substrate and forming an internal space with the base substrate so as to accommodate the electronic component therein, the intermediate layer having at least one through-hole that opens the internal space to an outside; and a sealing layer on the intermediate layer and sealing the internal space by closing the at least one through-hole.

A manufacturing method for an electronic device according to an aspect of the present invention includes preparing an aggregate substrate; forming a first sacrificial layer on the aggregate substrate; mounting the electronic component on the aggregate substrate while supporting part of the electronic component having a mechanical vibration portion with the first sacrificial layer; covering the electronic component with a second sacrificial layer; covering the second sacrificial layer with an intermediate layer having at least one through-hole that extends through the intermediate layer to the second sacrificial layer; forming an internal space between the aggregate substrate and the intermediate layer by removing the first sacrificial layer and the second sacrificial layer through the at least one through-hole; and sealing the internal space by closing the at least one through-hole with a sealing layer.

According to the present invention, an electronic device that has small frequency fluctuations due to a stress and that can be reduced in size and a manufacturing method for the electronic device are provided.

BRIEF DESCRIPTION OF THE DRAWINGS

FIG. 11 is a plan view schematically showing the configuration of a quartz crystal resonator unit according to a second embodiment.

FIG. 12 is a plan view schematically showing the configuration of a quartz crystal resonator unit according to a third embodiment.

FIG. 13 is a plan view schematically showing the configuration of a quartz crystal resonator unit according to a fourth embodiment.

DETAILED DESCRIPTION OF THE PREFERRED EMBODIMENTS

Hereinafter, embodiments of the present invention will be described with reference to the drawings. The drawings of the embodiments are illustrative, the dimensions and shapes of portions are schematic ones, and the technical scope of the invention of the subject application should not be interpreted limitedly to the embodiments.

The following description will be made by taking a quartz crystal resonator unit including a quartz crystal resonator as an example of a piezoelectric resonator unit. The quartz crystal resonator uses a quartz crystal element as a piezoelectric body that is excited by a piezoelectric effect.

The quartz crystal resonator unit corresponds to a kind of piezoelectric resonator unit that is an example of an electronic device. The quartz crystal resonator corresponds to a kind of piezoelectric resonator that is an example of an electronic component. The quartz crystal element corresponds to a kind of piezoelectric element. The vibration (drive) system of a resonator according to one embodiment of the present invention is not limited to piezoelectric drive. The resonator according to one embodiment of the present invention may be, for example, an electrostatically-actuated resonator using electrostatic force, a Lorentz force-actuated resonator using magnetic force, or the like other than a piezoelectrically-actuated resonator using a piezoelectric substrate. The electronic component is not limited to the above-described resonators as long as the electronic component has a mechanical vibration portion that mechanically vibrates.

The piezoelectric element according to embodiments of the present invention is not limited to a quartz crystal element. The piezoelectric element may be made from any piezoelectric material, such as a piezoelectric monocrystal, a piezoelectric ceramic, a piezoelectric thin film, and a piezoelectric polymer film. The piezoelectric monocrystal may be, for example, lithium niobate ($LiNbO_3$). Similarly, examples of the piezoelectric ceramic include barium titanate ($BaTiO_3$), lead titanate ($PbTiO_3$), lead zirconate titanate ($Pb(ZrXTi_{1-x})O_3$; PZT), aluminum nitride (AlN), lithium niobate ($LiNbO_3$), lithium metaniobate ($LiNb_2O_6$), bismuth titanate ($Bi_4Ti_3O_{12}$), lithium tantalate ($LiTaO_3$), lithium tetraborate ($Li_2B_4O_7$), langasite ($La_3Ga_5SiO_{14}$), and tantalum pentoxide ($Ta_2O_5$). The piezoelectric thin film may be the one formed by depositing the above-described piezoelectric ceramic on a substrate of quartz, sapphire, or the like by sputtering or the like. Examples of the piezoelectric polymer film include polylactic acid (PLA), polyvinylidene fluoride (PVDF), and vinylidene fluoride/trifluoroethylene (VDF/TrFE) copolymer. The above-described various piezoelectric materials may be used by laminating on top of each other or may be laminated on another member.

First Embodiment

Figure 1:
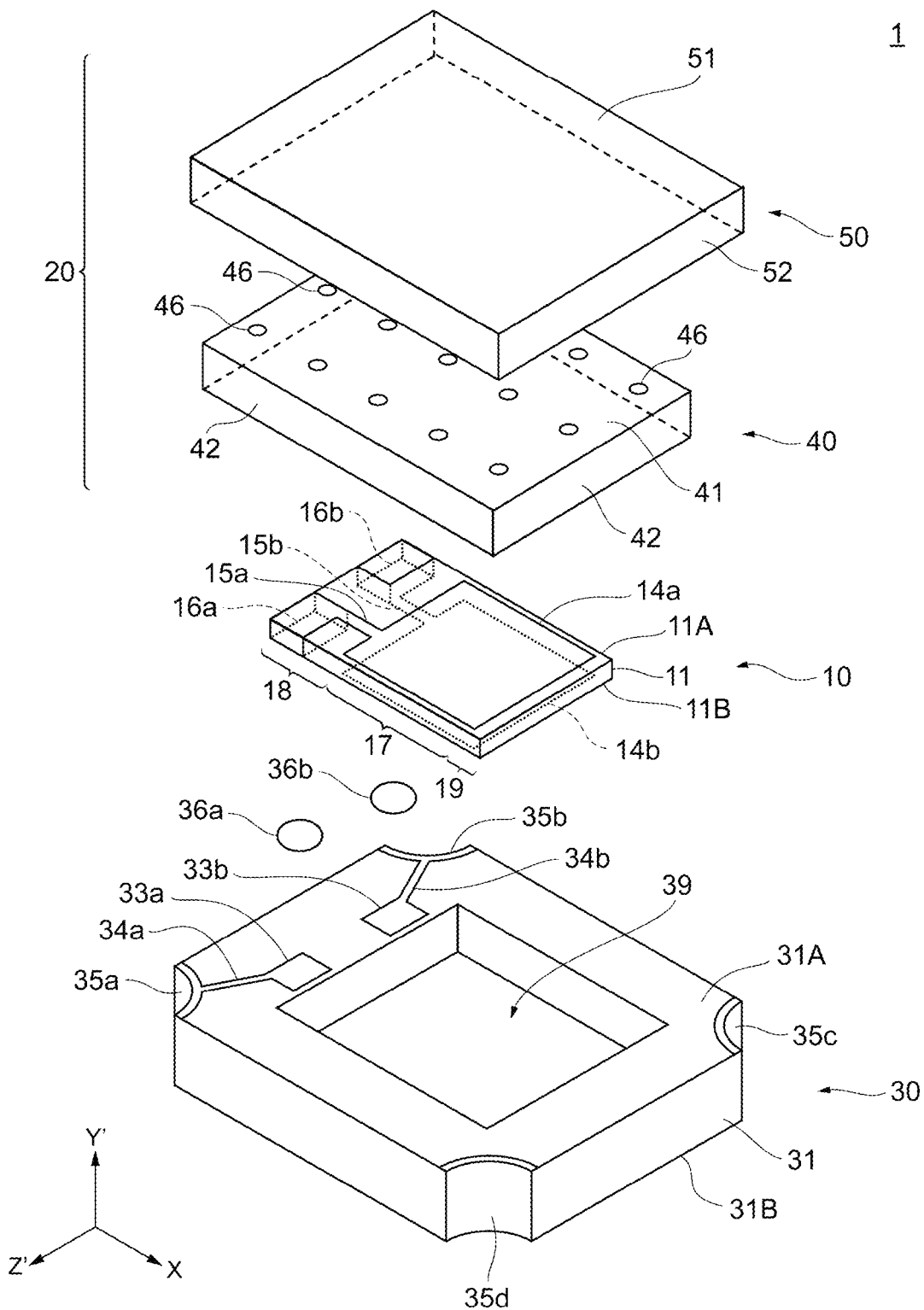
FIG. 1 is an exploded perspective view schematically showing the configuration of a quartz crystal resonator unit according to a first embodiment.
Figure 2:
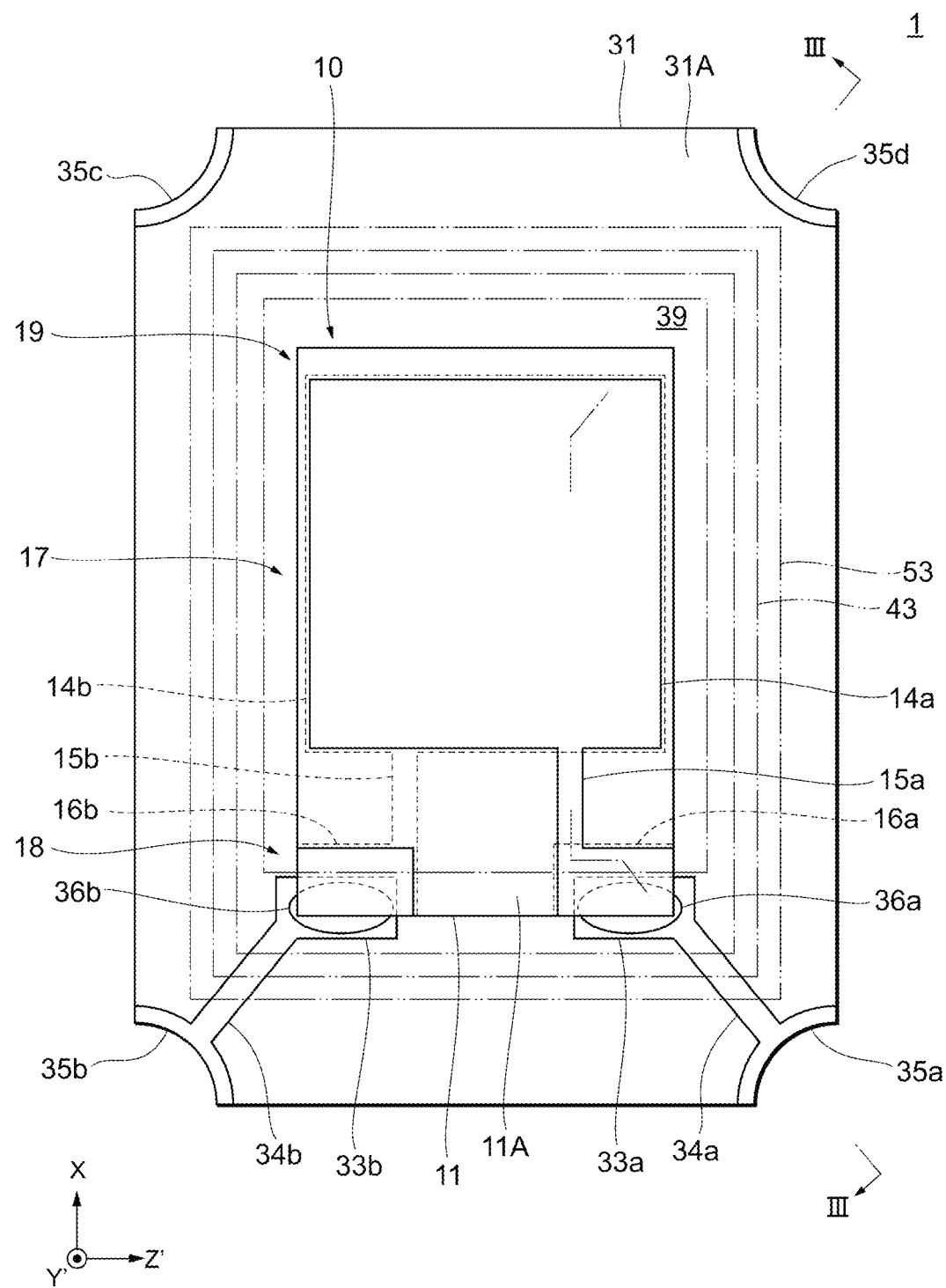
FIG. 2 is a plan view schematically showing the configuration of the quartz crystal resonator unit according to the first embodiment.
Figure 3:
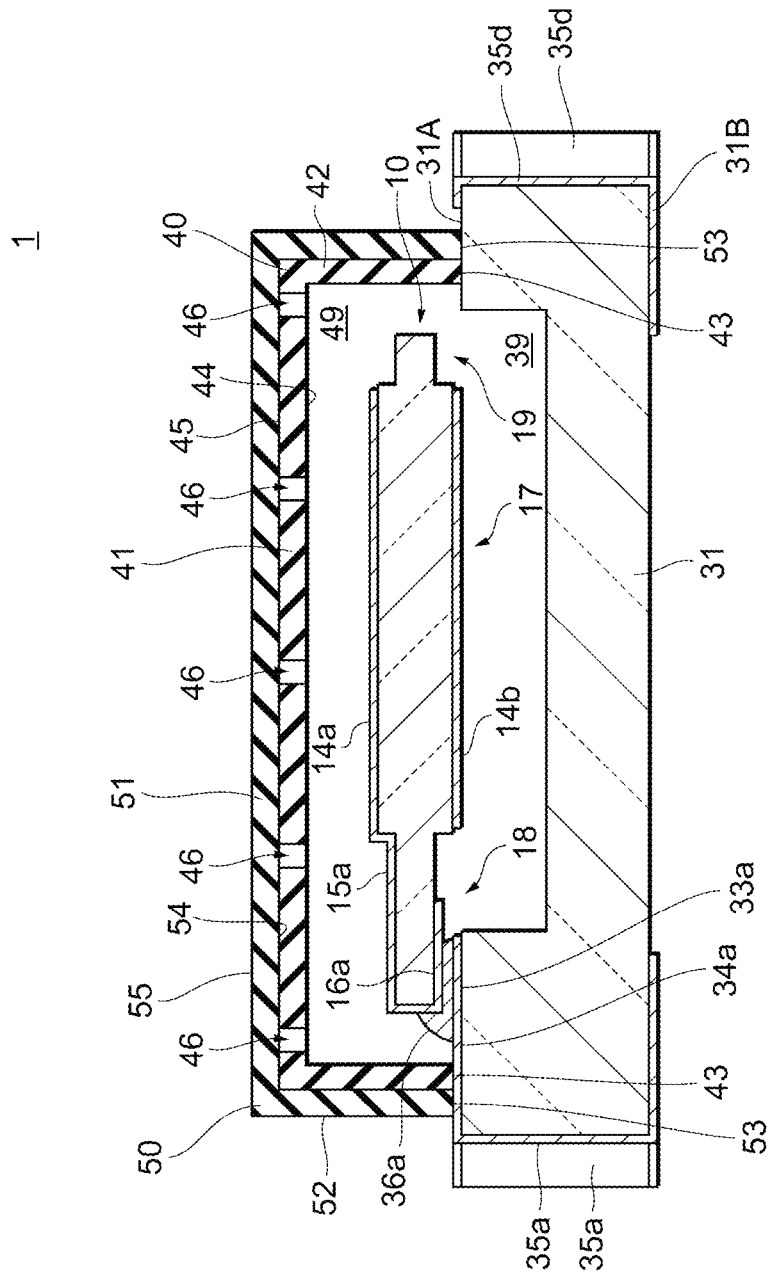
FIG. 3 is a cross-sectional view schematically showing the configuration of a cross section of the quartz crystal resonator unit shown in FIG. 2, taken along the line III-III.

Initially, the configuration of a quartz crystal resonator unit 1 according to a first embodiment of the present invention will be described with reference to FIG. 1 to FIG. 3. FIG. 1 is an exploded perspective view schematically showing the configuration of the quartz crystal resonator unit according to the first embodiment. FIG. 2 is a plan view schematically showing the configuration of the quartz crystal resonator unit according to the first embodiment. FIG. 3 is a cross-sectional view schematically showing the configuration of a cross section of the quartz crystal resonator unit shown in FIG. 2, taken along the line III-III. FIG. 3 is not a planar cross-sectional view and is a view showing a bent cross section including a first castellation electrode 35a, a first base wire 34a, a first electrode pad 33a, a first electrically conductive holding member 36a, a first connection electrode 16a, a first lead-out electrode 15a, a first excitation electrode 14a, and a fourth castellation electrode 35d (described later).

In each of the drawings, an orthogonal coordinate system of X-axis, Y'-axis, and Z'-axis may be provided for descriptive purposes to clarify the relation among the drawings and help understand the positional relation among members. The X-axis, the Y'-axis, and the Z'-axis respectively correspond to those among the drawings. The X-axis, the Y'-axis, and the Z'-axis respectively correspond to the crystallographic axes of a quartz crystal element 11 (described later). The X-axis corresponds to electrical axis (polar axis), Y-axis corresponds to machine axis, and Z-axis corresponds to optical axis. The Y'-axis and the Z'-axis are axes respectively obtained by rotating the Y-axis and the Z-axis about the X-axis by 35 degrees 15 minutes±one minute 30 seconds in the direction from the Y-axis to the Z-axis. In the following description, a direction parallel to the X-axis is referred to as X-axis direction, a direction parallel to the Y'-axis is referred to as Y'-axis direction, and a direction parallel to the Z'-axis is referred to as Z'-axis direction. The directions of the arrows of the X-axis, the Y'-axis, and the Z'-axis are referred to as "positive (plus)", and the directions opposite from the arrows are referred to as "negative (minus)".

As shown in FIG. 1, the quartz crystal resonator unit 1 includes a quartz crystal resonator 10, a lid member 20, and a base substrate 30. The lid member 20 includes an intermediate layer 40 and a sealing layer 50. The lid member 20 and the base substrate 30 make up a holder for accommodating the quartz crystal resonator 10. In the example shown in FIG. 1 to FIG. 3, the sides of the lid member 20 and the base substrate 30, facing each other, are recessed. Specifically, the lid member 20 has a closed-end opening portion for accommodating the quartz crystal resonator 10 on the side adjacent to the base substrate 30, and the base substrate 30 has a closed-end opening portion spaced apart from the quartz crystal resonator 10 on the side adjacent to the lid member 20. The shapes of the lid member 20 and the base substrate 30 are not limited to the above-described shapes. The base substrate 30 may have a closed-end opening portion for accommodating the quartz crystal resonator 10 on the side adjacent to the lid member 20. At least one of the lid member 20 and the base substrate 30 may be formed in a flat plate shape.

The quartz crystal resonator 10 is a device that converts electric energy and mechanical energy to each other by vibrating quartz crystal using a piezoelectric effect. The quartz crystal resonator 10 includes the thin-piece quartz crystal element 11, a first excitation electrode 14a and a second excitation electrode 14b that make up a pair of excitation electrodes, a first lead-out electrode 15a and a second lead-out electrode 15b that make up a pair of lead-out electrodes, and a first connection electrode 16a and a second connection electrode 16b that make up a pair of connection electrodes.

The quartz crystal element 11 has a top surface 11A and an undersurface 11B facing each other. The top surface 11A is located on a side across from a side facing the base substrate 30, that is, a side opposite a top portion 41 of the intermediate layer 40 (described later). The undersurface 11B is located on the side facing the base substrate 30.

The quartz crystal element 11 is, for example, an AT-cut quartz crystal element. The AT-cut quartz crystal element 11 is formed such that, in the orthogonal coordinate system of the X-axis, the Y'-axis, and the Z'-axis that intersect with one another, a plane parallel to a plane defined by the X-axis and the Z'-axis (hereinafter, referred to as XZ' plane; this also applies to planes defined by other axes) is a principal plane and a direction parallel to the Y'-axis is a thickness. For example, the AT-cut quartz crystal element 11 is formed by etching a quartz crystal substrate (for example, quartz crystal wafer) obtained by cutting and polishing synthetic quartz crystal.

The quartz crystal resonator 10 using the AT-cut quartz crystal element 11 has a high frequency stability in a wide temperature range. In the AT-cut quartz crystal resonator 10, a thickness shear vibration mode is used as a main vibration. The rotation angles of the Y'-axis and the Z'-axis in the AT-cut quartz crystal element 11 may be inclined at an angle within the range of −5 degrees or greater and 15 degrees or less from 35 degrees 15 minutes. Different cuts other than the AT cut may be adopted as the cut-angles of the quartz crystal element 11. For example, BT cut, GT cut, SC cut, or other cuts may be adopted. The quartz crystal resonator may be a tuning-fork quartz crystal resonator using a quartz crystal element having cut-angles, called Z plate.

The AT-cut quartz crystal element 11 has a plate shape with a long-side direction, a short-side direction, and a thickness direction. The long-side direction is a direction in which long sides parallel to the X-axis direction extend. The short-side direction is a direction in which short sides parallel to the Z'-axis direction extend. The thickness direction is a direction of thickness, parallel to the Y'-axis direction. The quartz crystal element 11 has a rectangular shape when the top surface 11A is viewed in plan view. The quartz crystal element 11 has an excitation portion 17 and peripheral portions 18, 19. The excitation portion 17 is located in the middle and contributes to excitation. The peripheral portions 18, 19 are adjacent to the excitation portion 17. The excitation portion 17 corresponds to a mechanical vibration portion. Of the peripheral portions adjacent to the excitation portion 17, the peripheral portion 18 is a portion located on the side in the negative X-axis direction when viewed from the excitation portion 17. Of the peripheral portions adjacent to the excitation portion 17, the peripheral portion 19 is a portion located on the side in the positive X-axis direction when viewed from the excitation portion 17. The excitation portion 17 and the peripheral portions 18, 19 each are formed in a band shape from one end to the other end of the quartz crystal element 11. The one end and the other end of the quartz crystal element 11 are on opposite sides from each other in the Z'-axis direction. As shown in FIG. 2, in the present embodiment, the excitation portion 17 and the peripheral portions 18, 19 each have a rectangular shape when viewed in plan view.

When the top surface 11A of the quartz crystal element 11 is viewed in plan view, the planar shape of the excitation portion 17 is not limited to the above shape. The peripheral portion 19 may be omitted, and the excitation portion 17 may be formed substantially all over the surface of a portion on the side in the positive X-axis direction in the quartz crystal element 11. Alternatively, the excitation portion 17 may be formed in an island shape so as to be surrounded all around by a peripheral portion. Alternatively, the shape of the excitation portion 17 may be a circular shape, an elliptical shape, a polygonal shape, or a combination of some of these shapes.

The excitation portion 17 is thicker than the peripheral portions 18, 19. The quartz crystal element 11 has a mesa structure on both sides. With this configuration, vibration leakage from the excitation portion 17 is reduced. In the example shown in FIG. 1 and FIG. 3, on each of the top surface 11A side and the undersurface 11B side of the quartz crystal element 11, the excitation portion 17 projects from the peripheral portions 18, 19 along the Y'-axis direction. In other words, on each of the top surface 11A side and the undersurface 11B side of the quartz crystal element 11, a step is formed at the boundary between the excitation portion 17 and the peripheral portion 18 and the boundary between the excitation portion 17 and the peripheral portion 19. The shape of the step at each of the boundary between the excitation portion 17 and the peripheral portion 18 and the boundary between the excitation portion 17 and the peripheral portion 19 is, for example, a tapered shape and may be another shape, such as a multi-step shape.

The cross-sectional shape of the quartz crystal element 11 is not limited to the above shape. The quartz crystal element 11 may have, for example, a one-side mesa structure that the excitation portion 17 projects from the peripheral portions 18, 19 on one of the top surface 11A and the undersurface 11B or a reverse-mesa structure that the excitation portion 17 is thinner than the peripheral portions 18, 19. The quartz crystal element 11 may have a convex structure or a bevel structure that the amount of change in thickness continuously changes between the excitation portion 17 and each of the peripheral portions 18, 19. The shape of the quartz crystal element 11 is not limited to a plate shape and may be, for example, a tuning-fork shape having a base portion and vibration arm portions extending from the base portion parallel to each other. The shape of the quartz crystal element 11 may be a flat plate shape that the thickness of the excitation portion 17 and the thickness of each of the peripheral portions 18, 19 are substantially equal to each other. A slit may be formed in the peripheral portion 18 for the purpose of reducing vibration leakage and stress transfer.

The first excitation electrode 14a is provided on the top surface 11A side of the excitation portion 17. The second excitation electrode 14b is provided on the undersurface 11B side of the excitation portion 17. In other words, the first excitation electrode 14a is provided on the side adjacent to the lid member 20, and the second excitation electrode 14b is provided on the side adjacent to the base substrate 30. The first excitation electrode 14a and the second excitation electrode 14b are provided on opposite sides of the quartz crystal element 11. When the top surface 11A of the quartz crystal element 11 is viewed in plan view, the first excitation electrode 14a and the second excitation electrode 14b are disposed so as to overlap in substantially the entire area. Each of the first excitation electrode 14a and the second excitation electrode 14b has long sides parallel to the X-axis direction, short sides parallel to the Z'-axis direction, and a thickness parallel to the Y'-axis direction.

The first lead-out electrode 15a electrically connects the first excitation electrode 14a and the first connection electrode 16a. The second lead-out electrode 15b electrically connects the second excitation electrode 14b and the second connection electrode 16b. As shown in FIG. 2, the first lead-out electrode 15a extended from the first excitation electrode 14a extends along the X-axis direction and is provided on the step on the top surface 11A side at the boundary between the excitation portion 17 and the peripheral portion 18, and on the top surface 11A of the peripheral portion 18. In addition, the second lead-out electrode 15b extended from the second excitation electrode 14b extends along the X-axis direction and is provided on the step on the undersurface 11B side at the boundary between the excitation portion 17 and the peripheral portion 18, and on the undersurface 11B of the peripheral portion 18. From the viewpoint of reducing a stray capacitance, when the top surface 11A of the quartz crystal element 11 is viewed in plan view, the first lead-out electrode 15a and the second lead-out electrode 15b are spaced apart from each other, and the first lead-out electrode 15a is provided in the positive Z'-axis direction when viewed from the second lead-out electrode 15b.

Each of the first connection electrode 16a and the second connection electrode 16b is an electrode for electrically connecting an associated one of the first excitation electrode 14a and the second excitation electrode 14b to the base substrate 30 and is provided on the undersurface 11B side of the peripheral portion 18. As shown in FIG. 2, the first connection electrode 16a and the second connection electrode 16b are provided side by side at an end portion of the peripheral portion 18 on the side in the negative X-axis direction, the first connection electrode 16a is provided at a corner portion on the side in the positive Z'-axis direction, and the second connection electrode 16b is provided at a corner portion on the side in the negative Z'-axis direction.

The first excitation electrode 14a, the first lead-out electrode 15a, and the first connection electrode 16a are integrally formed. The second excitation electrode 14b, the second lead-out electrode 15b, and the second connection electrode 16b are also similarly formed. The electrodes of the quartz crystal resonator 10 are provided by, for example, laminating chromium (Cr) and gold (Au) in this order. Chromium is more excellent in adhesion to the quartz crystal element 11 than gold. Gold is more excellent in chemical stability than chromium. For this reason, when the electrodes of the quartz crystal resonator 10 have a multilayer structure made up of chromium and gold, peeling and oxidation of the electrodes are reduced, so the highly-reliable quartz crystal resonator 10 is provided.

The base substrate 30 holds the quartz crystal resonator 10 such that the quartz crystal resonator 10 can be excited. The base substrate 30 includes a base 31 having a top surface 31A and an undersurface 31B opposite each other. The top surface 31A corresponds to a mounting surface that is located on the side adjacent to the quartz crystal resonator 10 and the lid member 20 and on which the quartz crystal resonator 10 is mounted. A closed-end opening portion 39 is formed on the top surface 31A side of the base substrate 30. The opening portion 39 overlaps part of an electronic component. As shown in FIG. 2, in the present embodiment, the opening portion 39 of the base substrate 30 overlaps the whole of the excitation portion 17 and the peripheral portion 19 of the quartz crystal resonator 10 and part of the peripheral portion 18. When the top surface 31A is viewed in plan view, the end surface of the base 31 is recessed in a cylindrical shape toward the center of the base 31 at each of the four corners. The base 31 is, for example, a sintered material, such as electrically insulating ceramic (alumina). From the viewpoint of reducing the generation of thermal stress, the base 31 is preferably made of a heat-resistant material. From the viewpoint of reducing a stress to be applied to the quartz crystal resonator 10 due to thermal hysteresis, the base 31 may be made of a material having a coefficient of thermal expansion close to that of the quartz crystal element 11 or may be made of, for example, quartz crystal.

The base substrate 30 includes the first electrode pad 33a and a second electrode pad 33b that make up a pair of electrode pads provided on the top surface 31A of the base 31. The first electrode pad 33a and the second electrode pad 33b are terminals for electrically connecting the quartz crystal resonator 10 to the base substrate 30. As shown in FIG. 2, at least part of the first electrode pad 33a overlaps the first connection electrode 16a, and at least part of the second electrode pad 33b overlaps the second connection electrode 16b.

The base substrate 30 includes the first castellation electrode 35a, a second castellation electrode 35b, a third castellation electrode 35c, and the fourth castellation electrode 35d provided on the surfaces of recessed portions respectively formed at the four corners among the end surfaces of the base 31. When the top surface 31A of the base substrate 30 is viewed in plan view as shown in FIG. 2, the second castellation electrode 35b is located on the side in the negative Z'-axis direction when viewed from the first castellation electrode 35a, the third castellation electrode 35c is located on the side in the positive X-axis direction when viewed from the second castellation electrode 35b, and the fourth castellation electrode 35d is located on the side in the positive Z'-axis direction when viewed from the third castellation electrode 35c. The quartz crystal resonator unit 1 is mounted on an external circuit board (not shown) by, for example, soldering the first castellation electrode 35a, the second castellation electrode 35b, the third castellation electrode 35c, and the fourth castellation electrode 35d. At this time, the first castellation electrode 35a and the second castellation electrode 35b are terminals for electrically connecting the external circuit board (not shown) and the quartz crystal resonator unit 1. The third castellation electrode 35c and the fourth castellation electrode 35d are dummy electrodes to which no electrical signal or the like is input or output and may be ground electrodes that improve the electromagnetic shield function of the lid member 20 by grounding at least part of the lid member 20. The first castellation electrode 35a, the second castellation electrode 35b, the third castellation electrode 35c, and the fourth castellation electrode 35d may be electrodes that electrically connect electrodes on the top surface 31A side of the base substrate 30 and outer electrodes on the undersurface 31B side. Such soldering of the quartz crystal resonator unit 1 with the external circuit board may be performed by using the outer electrodes on the undersurface 31B side.

The base substrate 30 includes the first base wire 34a and a second base wire 34b that make up a pair of base wires provided on the top surface 31A of the base 31. The first base wire 34a electrically connects the first electrode pad 33a and the first castellation electrode 35a. The second base wire 34b electrically connects the second electrode pad 33b and the second castellation electrode 35b.

The first electrically conductive holding member 36a and a second electrically conductive holding member 36b that make up a pair of electrically conductive holding members are provided on the top surface 31A side of the base substrate 30. Specifically, the first electrically conductive holding member 36a is provided on the first electrode pad 33a, and the second electrically conductive holding member 36b is provided on the second electrode pad 33b. The first electrically conductive holding member 36a and the second electrically conductive holding member 36b mount the quartz crystal resonator 10 on the base substrate 30 and electrically connect the quartz crystal resonator 10 and the base substrate 30. The first electrically conductive holding member 36a is joined with the first connection electrode 16a of the quartz crystal resonator 10 and electrically connects the first electrode pad 33a and the first connection electrode 16a. The second electrically conductive holding member 36b is joined with the second connection electrode 16b of the quartz crystal resonator 10 and electrically connects the second electrode pad 33b and the second connection electrode 16b. The first electrically conductive holding member 36a and the second electrically conductive holding member 36b hold the quartz crystal resonator 10 with a space from the base substrate 30 such that the excitation portion 17 can be excited. The first electrically conductive holding member 36a and the second electrically conductive holding member 36b are, for example, electrically conductive adhesive containing a thermoset resin, an ultraviolet curing resin, or the like, including a silicone resin as a main material and contain an additive, such as electrically conductive particles, for imparting electrical conductivity to the adhesive. For example, electrically conductive particles containing silver (Ag) are used as the electrically conductive particles. The main material of the electrically conductive adhesive may be an epoxy resin, or the like. The first electrically conductive holding member 36a and the second electrically conductive holding member 36b are provided by, after uncured electrically conductive adhesive paste that is a precursor is applied, curing the electrically conductive adhesive paste by chemical reaction caused by heating, ultraviolet irradiation, or the like. Furthermore, a filler for the purpose of increasing the strength or the purpose of keeping the space between the base substrate 30 and the quartz crystal resonator 10 may be added to the adhesive. The first electrically conductive holding member 36a and the second electrically conductive holding member 36b may be made of solder.

The intermediate layer 40 defines an internal space 49 with the base substrate 30. The internal space 49 accommodates the quartz crystal resonator 10. The intermediate layer 40 includes a flat-plate top portion 41 and a side wall portion 42. The top portion 41 faces the opening portion 39 of the base substrate 30 across the quartz crystal resonator 10. The side wall portion 42 is connected to the outer edge of the top portion 41 and extends in a direction that intersects with the top portion 41. The side wall portion 42 surrounds the quartz crystal resonator 10 in a Z'X-plane direction. The intermediate layer 40 has an inner surface 44 on the side adjacent to the internal space 49 and has an outer surface 45 on the side across from the inner surface 44. The intermediate layer 40 includes a facing surface 43 at the distal end of the side wall portion 42, adjacent to the base substrate 30. When the top surface 31A of the base substrate 30 is viewed in plan view as shown in FIG. 2, the facing surface 43 has a rectangular frame shape so as to surround the quartz crystal resonator 10 and is joined with the base 31. The facing surface 43 covers part of each of the first base wire 34a and the second base wire 34b. The intermediate layer 40 is made of, for example, a polysilicon, a silicon oxide, or the like.

The intermediate layer 40 has at least one through-hole 46 that opens the internal space 49 to the outside. The through-holes 46 are formed in the top portion 41 and are open at both sides of the inner surface 44 and the outer surface 45. When the top surface 31A of the base substrate 30 is viewed in plan view as shown in FIG. 2, at least a part of the plurality of through-holes 46 is formed in a region that overlaps the opening portion 39 of the base substrate 30. A part of the plurality of through-holes 46 may be located outside the opening portion 39. A part of the plurality of through-holes 46 that overlap the opening portion 39 of the base substrate 30 overlap the quartz crystal resonator 10, and another part of the plurality of through-holes 46 that overlap the opening portion 39 of the base substrate 30 are located outside the quartz crystal resonator 10. When the positions of the plurality of through-holes 46 are scattered, a sacrificial layer is efficiently removed in a manufacturing step, so a residual sacrificial layer in the opening portion 39 or the internal space 49 is reduced.

The sealing layer 50 is provided outside the intermediate layer 40 when viewed from the internal space 49 and seals the internal space 49 by closing the through-holes 46. The sealing layer 50 covers the intermediate layer 40 and includes a flat-plate top portion 51 and a side wall portion 52. The side wall portion 52 is connected to the outer edge of the top portion 51 and extends in a direction that intersects with the top portion 51. The sealing layer 50 has an inner surface 54 on the side adjacent to the intermediate layer 40 and has an outer surface 55 on the side across from the inner surface 54. The sealing layer 50 includes a facing surface 53 at the distal end of the side wall portion 52, adjacent to the base substrate 30. The inner surface 54 of the sealing layer 50 is in contact with the outer surface 45 of the intermediate layer 40 and closes the through-holes 46 at the top portion 51. When the top surface 31A of the base substrate 30 is viewed in plan view as shown in FIG. 2, the facing surface 53 has a rectangular frame shape so as to surround the quartz crystal resonator 10 and is joined with the base 31. The facing surface 53 covers part of each of the first base wire 34a and the second base wire 34b. The sealing layer 50 is made of, for example, a silicon nitride, or the like. The sealing layer 50 may be made of, for example, an electrically conductive material, such as a metal. In this case, the sealing layer 50 is imparted with an electromagnetic shield function that reduces entry and exit of electromagnetic waves to and from the internal space 49. When the sealing layer 50 is made of an electrically conductive material, the sealing layer 50 is provided apart from the first base wire 34a and the second base wire 34b. At this time, the sealing layer 50 may be electrically connected to the third castellation electrode 35c or the fourth castellation electrode 35d.

(Manufacturing Method)

Figure 4:
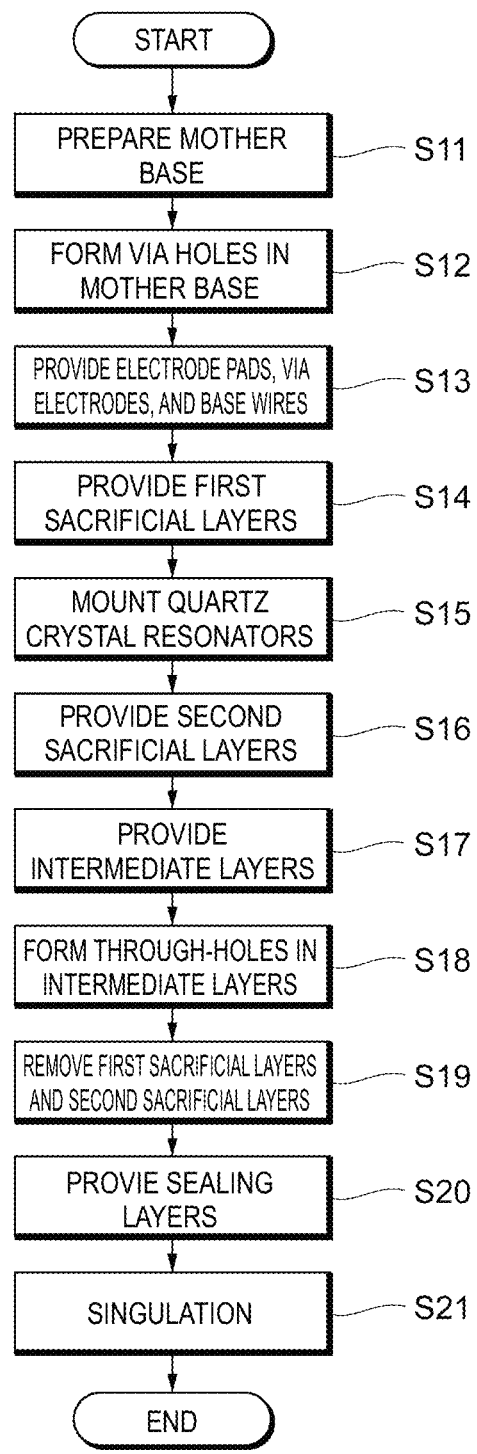
FIG. 4 is a flowchart schematically showing a manufacturing method for a quartz crystal resonator unit according to the first embodiment.
Figure 5:
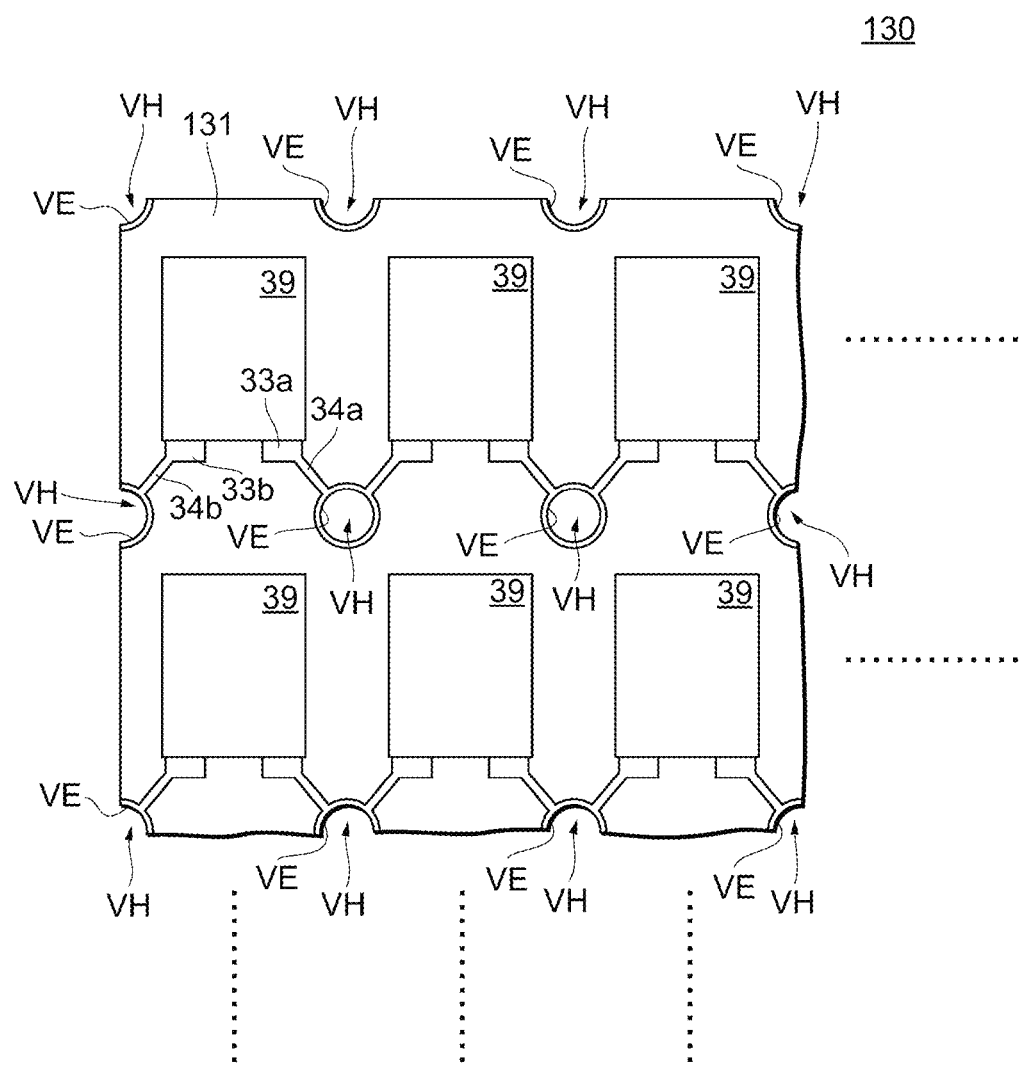
FIG. 5 is a plan view schematically showing a substrate preparation step of preparing an aggregate substrate.
Figure 6:
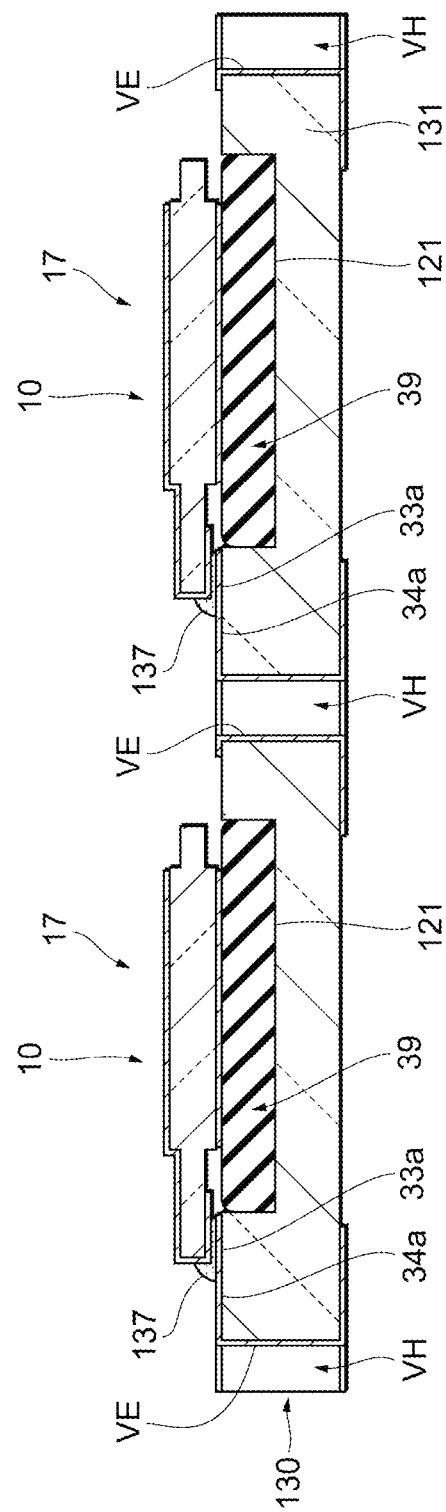
FIG. 6 is a cross-sectional view schematically showing a mounting step of mounting quartz crystal resonators.
Figure 7:
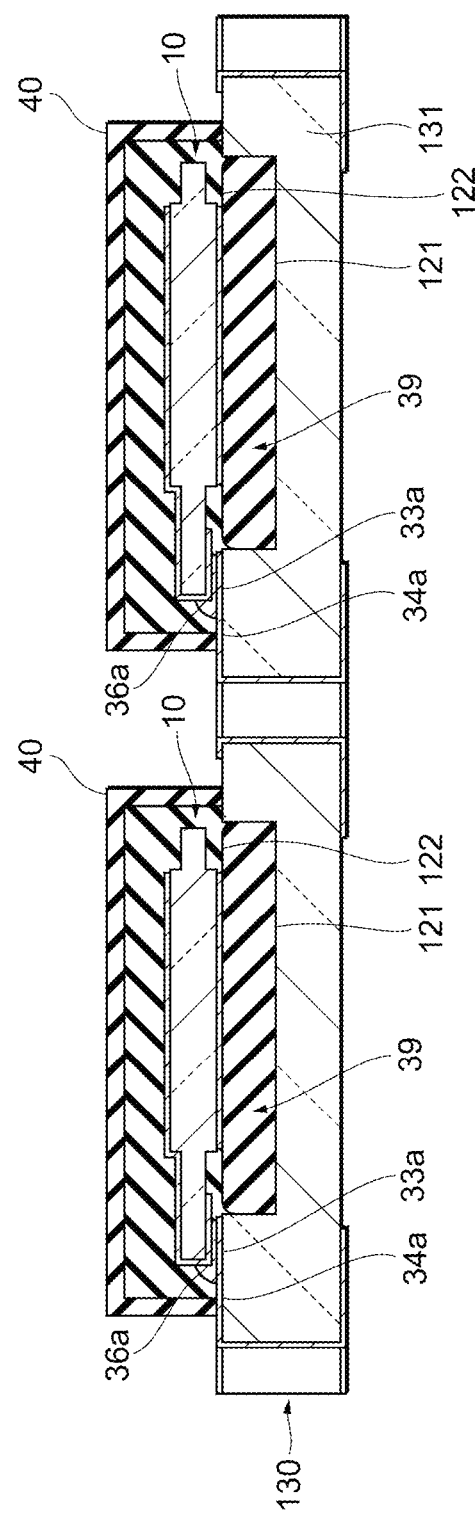
FIG. 7 is a cross-sectional view schematically showing an intermediate layer forming step of providing intermediate layers.
Figure 8:
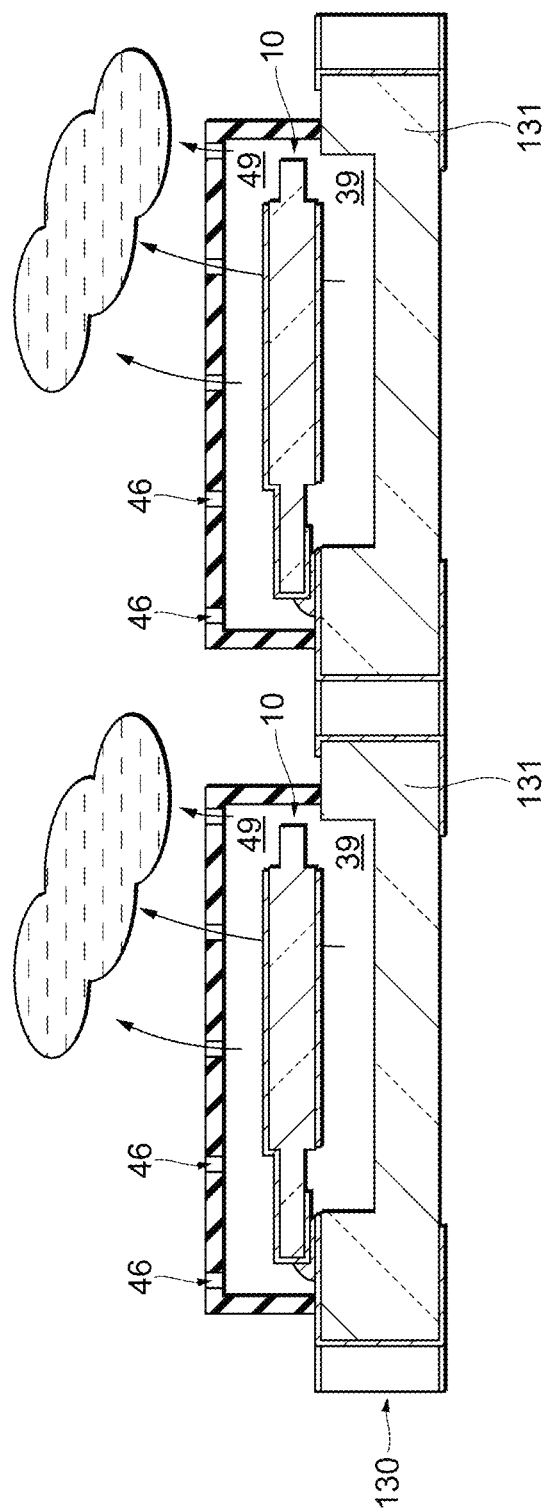
FIG. 8 is a cross-sectional view schematically showing a space forming step of removing first sacrificial layers and second sacrificial layers.
Figure 9:
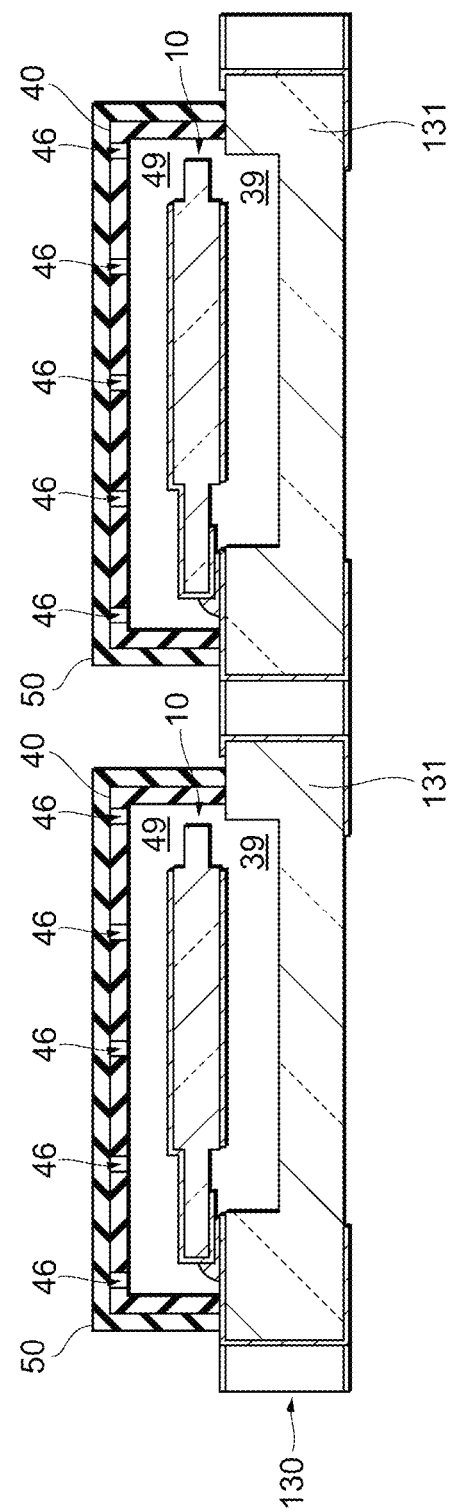
FIG. 9 is a cross-sectional view schematically showing a sealing step of providing sealing layers.
Figure 10:
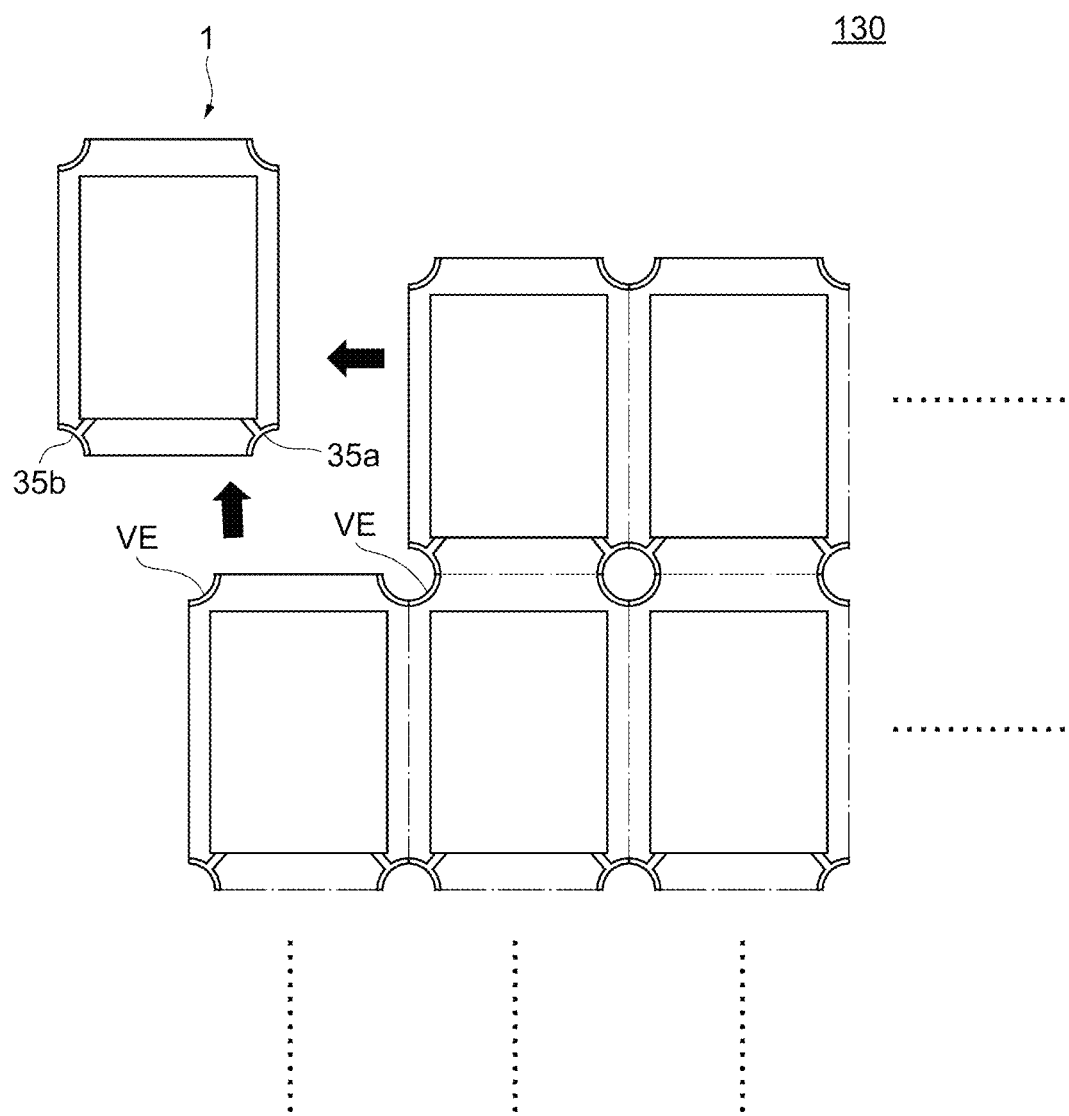
FIG. 10 is a plan view schematically showing a splitting step for singulation.

Next, a manufacturing method for the quartz crystal resonator unit 1 according to the first embodiment will be described with reference to FIG. 4 to FIG. 10. FIG. 4 is a flowchart schematically showing the manufacturing method for the quartz crystal resonator unit according to the first embodiment. FIG. 5 is a plan view schematically showing a substrate preparation step of preparing an aggregate substrate. FIG. 6 is a cross-sectional view schematically showing a mounting step of mounting quartz crystal resonators. FIG. 7 is a cross-sectional view schematically showing an intermediate layer forming step of providing intermediate layers. FIG. 8 is a cross-sectional view schematically showing a space forming step of removing first sacrificial layers and second sacrificial layers. FIG. 9 is a cross-sectional view schematically showing a sealing step of providing sealing layers. FIG. 10 is a plan view schematically showing a splitting step for singulation.

Initially, the aggregate substrate 130 is prepared (substrate preparation step). The substrate preparation step includes step S11 of preparing a mother base, step S12 of forming via holes in the mother base, and step S13 of providing electrode pads, via electrodes, and base wires. In step S11 of preparing a mother base, a green sheet is molded by using ceramic powder of which the main material is alumina. Subsequently, in step S12 of forming via holes in the mother base, opening portions 39 and via holes VH are formed in the green sheet. Subsequently, in step S13 of providing electrode pads, via electrodes, and base wires, the first electrode pads 33a and the second electrode pads 33b, the first base wires 34a and the second base wires 34b, and the via electrodes VE are provided on or in the green sheet by vapor deposition, such as physical vapor deposition (PVD) and chemical vapor deposition (CVD). Each of the via electrodes VE is provided in a hollow cylinder shape so as to cover the internal surface of an associated one of the via holes VH. Subsequently, the green sheet is fired at approximately 1600° C. in hydrogen atmosphere. Thus, as shown in FIG. 5, the mother base 131 made of ceramic (alumina) is formed, and the aggregate substrate 130 is obtained. At this time, the mother base 131 shrinks by, for example, about 20% through firing. The first electrode pads 33a and the second electrode pads 33b, the first base wires 34a and the second base wires 34b, and the via electrodes VE may be provided by a deposition method other than vapor deposition, such as plating and printing. The opening portions 39 and the via holes VH may be formed after the green sheet is fired. At this time, the first electrode pads 33a and the second electrode pads 33b, the first base wires 34a and the second base wires 34b, and the via electrodes VE may be formed after the green sheet is fired.

Subsequently, first sacrificial layers are provided (sacrificial layer forming step S14).

As shown in FIG. 6, a first sacrificial layer 121 is provided inside each of the opening portions 39 of the aggregate substrate 130. The material of each first sacrificial layer 121 is not limited as long as the material can be removed by wet etching or dry etching, and, for example, a silicon oxide, an amorphous silicon, a photoresist, another polymer material, or the like may be selected as needed.

Subsequently, quartz crystal resonators are mounted (mounting step S15).

In this step, as shown in FIG. 6, initially, uncured pasty electrically conductive adhesive 137 is applied onto the first electrode pads 33a and the second electrode pads 33b with, for example, a dispenser. A method of applying the electrically conductive adhesive 137 is not limited to the above method and may be provided by gravure printing, screen printing, ink-jet printing, or the like. Subsequently, while the excitation portion 17 of each quartz crystal resonator 10 is supported by the first sacrificial layer 121, the electrically conductive adhesive 137 is sandwiched by the aggregate substrate 130 and the quartz crystal resonator 10. Subsequently, as shown in FIG. 7, while the excitation portion 17 of each quartz crystal resonator 10 remains supported by the first sacrificial layer 121, the electrically conductive adhesive 137 is cured. A portion supported by each first sacrificial layer 121 is not limited to the excitation portion 17 as long as the portion is part of the quartz crystal resonator 10 and may be the peripheral portion 18 or the peripheral portion 19.

Subsequently, second sacrificial layers are provided (sacrificial layer covering step S16).

A second sacrificial layer 122 is provided so as to cover each quartz crystal resonator 10. The material of each second sacrificial layer 122 is selected as needed from among materials similar to the material of each first sacrificial layer 121.

Subsequently, intermediate layers are provided (S17).

As shown in FIG. 7, an intermediate layer 40 covers each second sacrificial layer 122 and is in contact with the aggregate substrate 130. Each intermediate layer 40 is formed so as to cover part of the base wires. A method of forming the intermediate layers 40 is selected as needed from among, for example, PVD, CVD, and the like. The film thickness of each intermediate layer 40 is set such that the intermediate layer 40 has a strength capable of maintaining the internal space 49 after the second sacrificial layer 122 is removed.

Subsequently, through-holes are formed in the intermediate layers (S18).

At least one through-hole 46 for each intermediate layer 40 is formed by, for example, dry etching using a photoresist technique. As a result of formation of the through-holes 46, each second sacrificial layer 122 is exposed to the outside through the through-holes 46. The dimension of each through-hole 46 is set such that, in sealing step S20 of providing sealing layers 50 (described later), a material for forming the sealing layers 50 does not enter the internal spaces 49 through the through-holes 46. Each through-hole 46 may be formed at a position that does not overlap the quartz crystal resonator 10 such that, even when the material for forming each sealing layer 50 enters the internal space 49, the material does not adhere to the quartz crystal resonator 10 to change the resonant frequency. The intermediate layer forming step in the present embodiment includes step S17 and step S18; however, the intermediate layer forming step is not limited to this configuration. In the intermediate layer forming step, for example, each intermediate layer 40 having through-holes 46 may be formed by providing a photoresist in advance at a position where each through-hole 46 is formed, forming an intermediate layer on the second sacrificial layer 122 and the photoresist, and removing the photoresist together with the intermediate layer formed thereon.

Subsequently, the first sacrificial layers and the second sacrificial layers are removed (space forming step S19).

Each first sacrificial layer 121 and each second sacrificial layer 122 are subjected to removal treatment, such as dry etching and wet etching, through the through-holes 46 of the intermediate layer 40. As shown in FIG. 8, each opening portion 39 of the aggregate substrate 130 becomes a cavity by removing the first sacrificial layer 121, and the internal space 49 of each intermediate layer 40 becomes a cavity by removing the second sacrificial layer 122. When a photoresist is used as each first sacrificial layer 121 and each second sacrificial layer 122, for example, a solution that dissolves the photoresist but does not react with the quartz crystal element 11 of the quartz crystal resonator 10 or various electrodes is appropriately selected.

Subsequently, sealing layers are provided (sealing step S20).

As shown in FIG. 9, a sealing layer 50 is provided outside each intermediate layer 40 so as to cover the entire surface of the intermediate layer 40 and seal the internal space 49 and the opening portion 39 by closing the through-holes 46. Each sealing layer 50 is formed so as to be in contact with the aggregate substrate 130 and cover part of the base wires. A method of forming the sealing layers 50 is selected as needed from among, for example, PVD, CVD, and the like. The film thickness of each sealing layer 50 is set such that the sealing layer 50 has a strength capable of maintaining the opening portion 39 of the base substrate 30 and the internal space 49 of the intermediate layer 40 in cooperation with the intermediate layer 40.

The manufacturing method for the quartz crystal resonator unit 1 may further include a heating step of closing the through-holes 46 by heating each intermediate layer 40 before sealing step S20. Such a heating step is not limited to completely closing each through-hole 46 and may be performed by reducing the dimension of each through-hole 46 to make it easy to perform the following sealing step S20.

Finally, the aggregate substrate is split for singulation (splitting step S21).

The aggregate substrate 130 is singulated into a plurality of quartz crystal resonator units 1 by cutting along scribe lines. In cutting the aggregate substrate 130, for example, a dicing machine using laser or a dicing saw is used. The scribe lines are set so as to cross the via holes VH, and each via electrode VE is split as a result of cutting of the aggregate substrate 130. The split via electrodes VE form castellation electrodes of each quartz crystal resonator unit 1.

As described above, the quartz crystal resonator unit 1 according to the first embodiment includes the base substrate 30 having the closed-end opening portion 39 that overlaps part of the quartz crystal resonator 10, the intermediate layer 40 joined with the base substrate 30 and having the at least one through-hole 46, and the sealing layer 50 provided outside the intermediate layer 40 and sealing the internal space 49 by closing the through-hole 46. In addition, the manufacturing method for the quartz crystal resonator unit 1 according to the first embodiment includes the substrate preparation step composed of step S11, step S12, and step S13, the sacrificial layer forming step S14 of providing the first sacrificial layers 121 on the aggregate substrate 130, the mounting step S15 of mounting each quartz crystal resonator 10 on the aggregate substrate 130 while part of the quartz crystal resonator 10 is being supported by an associated one of the first sacrificial layers 121, the sacrificial layer covering step S16 of covering each quartz crystal resonator 10 with the second sacrificial layer 122, the intermediate layer forming step of covering each second sacrificial layer 122 with the intermediate layer 40 having the at least one through-hole 46 and composed of step S17 and step S18, the space forming step S19 of removing each first sacrificial layer 121 and each second sacrificial layer 122 through the through-hole 46, the sealing step S20 of sealing each internal space 49 by closing the through-hole 46 with the sealing layer 50, and the splitting step S21 of forming castellation electrodes by splitting the aggregate substrate 130.

With this configuration, a low-cost, small electronic device is provided by creating the electronic device at the wafer level. In comparison with an electronic device in which the entire circumference of the end portion of an electronic component is fixed by a base substrate, a lid member, and the like so as to surround a mechanical vibration portion, stress transfer to the mechanical vibration portion is reduced. Therefore, according to the present embodiment, an electronic device that has small frequency fluctuations due to a stress and that can be reduced in size and a manufacturing method for the electronic device are provided. In mounting an electronic component on a base substrate, part of the electronic component is supported by a first sacrificial layer until electrically conductive adhesive is cured. Thus, a mounting position of the electronic component is stabilized, so physical interference between the electronic component and the base substrate is prevented.

Hereinafter, the configuration of a stress sensor according to other embodiments of the present invention will be described. In the following embodiments, the description of similar matters to those of the first embodiment is omitted, and only the differences will be described. Particularly, similar operation and advantageous effects with a similar configuration will not be described one by one.

Second Embodiment

Next, the configuration of a quartz crystal resonator unit 2 according to a second embodiment will be described with reference to FIG. 11. FIG. 11 is a cross-sectional view schematically showing the configuration of the quartz crystal resonator unit according to the second embodiment.

The second embodiment differs from the first embodiment in that no opening portion is formed in a base 231 of a base substrate 230 and a quartz crystal resonator 210 is mounted on a planar top surface 231A. The quartz crystal resonator 210 is mounted in an inclined manner at a base point of a first electrically conductive holding member 236a such that a peripheral portion 219 is located farther from the base substrate 230 than a peripheral portion 218. Such a quartz crystal resonator unit 2 is realized by, for example, mounting the quartz crystal resonator 210 on the base substrate 230 while the peripheral portion 219 is being supported by a first sacrificial layer. The point that through-holes 246 are formed in an intermediate layer 240 and a sealing layer 250 closes the through-holes 246 is similar to that of the first embodiment.

According to the present embodiment, an electronic component can be held by a base substrate at a selected angle. In addition, in a manufacturing process, minute adjustment of a mounting angle of an electronic component is easy by supporting the distal end of the electronic component with a first sacrificial layer. These advantageous effects are obtained even when the mounting surface of the base substrate has a planar shape.

Third Embodiment

Next, the configuration of a quartz crystal resonator unit 3 according to a third embodiment will be described with reference to FIG. 12. FIG. 12 is a cross-sectional view schematically showing the configuration of the quartz crystal resonator unit according to the third embodiment.

The third embodiment differs from the first embodiment in that a quartz crystal resonator 310 has a so-called double-support structure in which the quartz crystal resonator 310 is joined with a base substrate 330 by a peripheral portion 318 and a peripheral portion 319. The peripheral portion 318 is joined with the base substrate 330 by a first electrically conductive holding member 336a. The peripheral portion 319 is joined with the base substrate 330 by a second electrically conductive holding member 336b. The point that an opening portion 339 is formed on a top surface 331A side of a base 331, through-holes 346 are formed in an intermediate layer 340, and a sealing layer 350 closes the through-holes 346 is similar to that of the first embodiment.

In such an embodiment as well, an electronic device that has small frequency fluctuations due to a stress and that can be reduced in size and a manufacturing method for the electronic device are provided, and a mounting position of an electronic component is stabilized.

Fourth Embodiment

The configuration of a quartz crystal resonator unit 4 according to a fourth embodiment will be described with reference to FIG. 13. FIG. 13 is a cross-sectional view schematically showing the configuration of the quartz crystal resonator unit according to the fourth embodiment.

The fourth embodiment differs from the first embodiment in that a through via 435a is formed in a base 431 of a base substrate 430 and no castellation electrode is provided on the end surfaces of the base substrate 430. The through via 435a extends through the base 431 and electrically connects an electrode pad 433a on a top surface 431A side of the base substrate 430 and an outer electrode on an undersurface 431B side. When the top surface 431A of the base substrate 430 is viewed in plan view, the through via 435a overlaps an intermediate layer 440. The point that an opening portion 439 is formed on the top surface 431A side of the base 431, through-holes 446 are formed in the intermediate layer 440, and a sealing layer 450 closes the through-holes 446 is similar to that of the first embodiment.

In the present embodiment as well, similar advantageous effects to the above-described ones are obtained.

Hereinafter, part or all of the embodiments of the present invention will be described as appendices, and the advantageous effects thereof will be described. The present invention is not limited to the following appendices.

According to an aspect of the present invention, an electronic device is provided. The electronic device includes an electronic component having a mechanical vibration portion, a base substrate on which the electronic component is mounted, an intermediate layer forming an internal space with the base substrate, the internal space accommodating the electronic component, the intermediate layer having at least one through-hole that opens the internal space to an outside, and a sealing layer provided outside the intermediate layer and sealing the internal space by closing the at least one through-hole. A closed-end opening portion that overlaps part of the electronic component is formed on a mounting surface of the base substrate on which the electronic component is mounted.

With this configuration, a low-cost, small electronic device is provided by creating the electronic device at the wafer level. In comparison with an electronic device in which the entire circumference of the end portion of an electronic component is fixed by a base substrate, a lid member, and the like so as to surround a mechanical vibration portion, stress transfer to the mechanical vibration portion is reduced. Therefore, according to the present embodiment, an electronic device that has small frequency fluctuations due to a stress and that can be reduced in size and a manufacturing method for the electronic device are provided. In mounting an electronic component on a base substrate, part of the electronic component is supported by a first sacrificial layer until electrically conductive adhesive is cured. Thus, a mounting position of the electronic component is stabilized, so physical interference between the electronic component and the base substrate is prevented.

As one aspect, the base substrate includes an electrode pad provided on the mounting surface and with which the electronic component is joined, a castellation electrode provided on an end surface, and a base wire electrically connecting the electrode pad and the castellation electrode.

With this configuration, in comparison with an electronic device including a through via communicating with a sealed internal space, there is no leak through a gap between the through via and the base, so high sealing performance is obtained. In addition, formation of a through via is omitted, so manufacturing is easy.

As one aspect, the sealing layer is joined with the base substrate and covers part of the base wire.

With this configuration, leak through a gap between the base wire and surroundings is reduced, so high sealing performance is obtained.

As one aspect, when the mounting surface of the base substrate is viewed in plan view, the at least one through-hole is formed in a region that overlaps the opening portion.

With this configuration, the first sacrificial layer and the second sacrificial layer are efficiently removed.

As one aspect, when the mounting surface of the base substrate is viewed in plan view, the at least one through-hole is formed outside a region that overlaps the mechanical vibration portion of the electronic component.

With this configuration, in forming the sealing layer, adhesion of the material of the sealing layer to the mechanical vibration portion is reduced, so a change in the frequency of the mechanical vibration portion is reduced.

As one aspect, the electronic component is a quartz crystal resonator.

According to another aspect of the present invention, a manufacturing method for an electronic device is provided. The manufacturing method includes preparing an aggregate substrate, providing a first sacrificial layer on the aggregate substrate, mounting an electronic component on the aggregate substrate while supporting part of the electronic component having a mechanical vibration portion with the first sacrificial layer, covering the electronic component with a second sacrificial layer, covering the second sacrificial layer with an intermediate layer having at least one through-hole that extends through the intermediate layer to the second sacrificial layer, forming an internal space between the aggregate substrate and the intermediate layer by removing the first sacrificial layer and the second sacrificial layer through the at least one through-hole, and sealing the internal space by closing the at least one through-hole with a sealing layer. With this configuration, a low-cost, small electronic device is provided by creating the electronic device at the wafer level. In comparison with an electronic device in which the entire circumference of the end portion of an electronic component is fixed by a base substrate, a lid member, and the like so as to surround a mechanical vibration portion, stress transfer to the mechanical vibration portion is reduced. Therefore, according to the present embodiment, an electronic device that has small frequency fluctuations due to a stress and that can be reduced in size and a manufacturing method for the electronic device are provided. In mounting an electronic component on a base substrate, part of the electronic component is supported by a first sacrificial layer until electrically conductive adhesive is cured. Thus, a mounting position of the electronic component is stabilized, so physical interference between the electronic component and the base substrate is prevented.

As one aspect, a closed-end opening portion overlapping part of the electronic component is formed on a mounting surface of the aggregate substrate, on which the electronic component is mounted, and the first sacrificial layer is provided in the opening portion.

With this configuration, a distance between the electronic component and the base substrate is shortened, so a low-profile electronic device is obtained.

As one aspect, the substrate is prepared by preparing a mother base, a forming a via hole extending through the mother base, and providing a via electrode covering an internal surface of the via hole, and the manufacturing method further includes after the sealing of the internal space by closing the at least one through-hole with the sealing layer, singulating the aggregate substrate into a base substrate along the via electrode so as to form a castellation electrode at an end surface of the base substrate. With this configuration, in comparison with a manufacturing method for an electronic device including a through via communicating with a sealed internal space, there is no leak through a gap between the through via and the base, so an electronic device with high sealing performance is manufactured. In addition, formation of a through via is omitted, so manufacturing of an electronic device is easy.

As one aspect, an electrode pad electrically connected to the electronic component and a base wire electrically connected to the via electrode are provided on the aggregate substrate, and the sealing layer is joined with the aggregate substrate and covers part of the base wire.

With this configuration, leak through a gap between the base wire and surroundings is reduced, so an electronic device with high sealing performance is manufactured.

As one aspect, the electronic component is a quartz crystal resonator.

As described above, according to the aspects of the present invention, an electronic device that has small frequency fluctuations due to a stress and that can be reduced in size and a manufacturing method for the electronic device are provided.

The embodiments described above are intended to easily understand the present invention, and are not intended to limit interpretation of the present invention. The present invention may be modified or improved without departing from the purport of the present invention, and the present invention also encompasses equivalents thereof. That is, each of the embodiments with design changes made by persons skilled in the art as needed is also included in the scope of the present invention as long as it includes the features of the present invention. For example, elements of each embodiment, the disposition, materials, conditions, shapes, sizes, and the like, of the elements are not limited to the illustrated ones, and may be changed as needed. For example, a resonator and a resonator unit of the present invention can be used in a timing device or a load sensor. The elements of each embodiment may be combined with one another as long as it is technically possible, and these combinations are also included in the scope of the present invention as long as they include the features of the present invention.

REFERENCE SIGNS LIST 1 quartz crystal resonator unit
10 quartz crystal resonator
11 quartz crystal element
11A top surface
11B undersurface
14a, 14b excitation electrode
15a, 15b lead-out electrode
16a, 16b connection electrode
17 excitation portion
18, 19 peripheral portion
30 base substrate
31 base
31A top surface
31B undersurface
33a, 33b electrode pad
34a, 34b base wire
35a to 35d castellation electrode
36a, 36b electrically conductive holding member
39 opening portion
40 intermediate layer
46 through-hole
49 internal space
50 sealing layer

The invention claimed is:

1. An electronic device comprising:
a base substrate having a mounting surface;
an electronic component having a mechanical vibration portion mounted on the mounting surface of the base substrate;
an intermediate layer mounted on the base substrate and forming an internal space with the base substrate so as to accommodate the electronic component therein, the intermediate layer having at least one through-hole that opens the internal space to an outside; and
a sealing layer on the intermediate layer and sealing the internal space by closing the at least one through-hole, wherein the base substrate includes:
an electrode pad on the mounting surface and joined to the electronic component,
a castellation electrode on an end surface of the base substrate, and
a base wire electrically connecting the electrode pad and the castellation electrode, and
wherein the sealing layer is joined to the base substrate and covers part of the base wire.

2. The electronic device according to claim 1, wherein the mounting surface of the base substrate has a closed-end opening portion, and part of the electronic component overlaps the closed-end opening portion.

3. The electronic device according to claim 2, wherein, when the mounting surface of the base substrate is viewed in plan view thereof, the at least one through-hole is in a region that overlaps the closed-end opening portion.

4. The electronic device according to claim 1, wherein the electronic component is a quartz crystal resonator.

5. The electronic device according to claim 1, wherein a material of the intermediate layer is selected from polysilicon and silicon oxide.

6. The electronic device according to claim 5, wherein a material of the sealing layer is selected from silicon nitride or an electrically conductive material.

7. The electronic device according to claim 1, wherein a material of the sealing layer is selected from silicon nitride or an electrically conductive material.

8. The electronic device according to claim 1, wherein the at least one through-hole is only in a top portion of the intermediate layer that faces the base substrate.

9. A manufacturing method for an electronic device, the manufacturing method comprising:
preparing an aggregate substrate by:
preparing a mother base;
forming a via hole extending through the mother base; and
providing a via electrode covering an internal surface of the via hole;
forming a first sacrificial layer on the aggregate substrate;
mounting an electronic component on the aggregate substrate such that the first sacrificial layer supports a part of the electronic component having a mechanical vibration portion;
forming an electrode pad electrically connected to the electronic component and a base wire electrically connected to the via electrode on the aggregate substrate;
covering the electronic component with a second sacrificial layer;
covering the second sacrificial layer with an intermediate layer having at least one through-hole that extends through the intermediate layer to the second sacrificial layer;
forming an internal space between the aggregate substrate and the intermediate layer by removing the first sacrificial layer and the second sacrificial layer through the at least one through-hole;
sealing the internal space by closing the at least one through-hole with a sealing layer;
joining the sealing layer with the aggregate substrate so as to cover part of the base wire; and
after the sealing of the internal space by closing the at least one through-hole with the sealing layer, singulating the aggregate substrate into a base substrate along the via electrode so as to form a castellation electrode at an end surface of the base substrate.

10. The manufacturing method for an electronic device according to claim 9, further comprising:
    forming a closed-end opening portion that overlaps part of the electronic component on a mounting surface of the aggregate substrate on which the electronic component is mounted; and
    forming the first sacrificial layer in the closed-end opening portion.

11. The manufacturing method for an electronic device according to claim 9, wherein the electronic component is a quartz crystal resonator.

* * * * *